United States Patent
Tokura et al.

(10) Patent No.: US 7,485,937 B2
(45) Date of Patent: *Feb. 3, 2009

(54) TUNNEL JUNCTION DEVICE

(75) Inventors: Yoshinori Tokura, Tsukuba (JP);
Masashi Kawasaki, Tsukuba (JP);
Hiroshi Akoh, Tsukuba (JP); Hiroyuki Yamada, Tsukuba (JP); Yuji Ishii, Tsukuba (JP); Hiroshi Sato, Tsukuba (JP); Yoshio Kaneko, Chiba (JP)

(73) Assignees: National Institute of Advanced Industrial Science and Technology, Tokyo (JP); Japan Science and Technology Agency, Kawaguchi-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/591,246

(22) PCT Filed: Feb. 25, 2005

(86) PCT No.: PCT/JP2005/003099

§ 371 (c)(1),
(2), (4) Date: May 8, 2007

(87) PCT Pub. No.: WO2005/086250

PCT Pub. Date: Sep. 15, 2005

(65) Prior Publication Data

US 2007/0212572 A1  Sep. 13, 2007

(30) Foreign Application Priority Data

Mar. 5, 2004 (JP) .............................. 2004-062073

(51) Int. Cl.
*H01L 43/08* (2006.01)
(52) U.S. Cl. ...................................... 257/421; 257/422
(58) Field of Classification Search ................. 257/421, 257/422
See application file for complete search history.

(56) References Cited

U.S. PATENT DOCUMENTS

| 6,117,571 A * | 9/2000 | Baum et al. ................. 428/697 |
| 6,556,473 B2 * | 4/2003 | Saito et al. ................... 365/158 |
| 2003/0001178 A1 * | 1/2003 | Hsu et al. ..................... 257/296 |

FOREIGN PATENT DOCUMENTS

| JP | 2000 357828 | 12/2000 |
| JP | 2001-320108 | * 11/2001 |
| JP | 2003 068983 | 3/2003 |

OTHER PUBLICATIONS

R. Cauro, Persistent and transient photoconductivity in oxygen-deficient La2/3Sr1/3MoO3-σ thin films, Apr. 10, 2001, The American Physical Society, 63, 6.*
U.S. Appl. No. 10/591,246, filed Aug. 31, 2006, Tokura et al.
U.S. Appl. No. 10/569,089, filed Feb. 21, 2006, Tokura et al.

* cited by examiner

*Primary Examiner*—Cuong Q Nguyen
*Assistant Examiner*—Trang Q Tran
(74) *Attorney, Agent, or Firm*—Oblon, Spivak, McClelland, Maier & Neustadt, P.C.

(57) ABSTRACT

A tunnel junction device capable of controlling its spin retention is provided. The tunnel junction device includes a $La_{0.6}Sr_{0.4}MnO_{3-\delta}$ electrode (12), a $La_{0.6}Sr_{0.4}Mn_{1-y}Ru_yO_{3-\delta}$ electrode (14), both as ferromagnetic (including ferrimagnetic) metal materials, and a $LaAlO_{3-\delta}$ (electrically insulating layer) (13) arranged between the two electrodes (12) and (14).

10 Claims, 7 Drawing Sheets

FIG. 11

TUNNEL JUNCTION DEVICE

TECHNICAL FIELD

The present invention relates to tunnel junction devices and is applied to magnetic heads necessary for reading out information stored by magnetization. This technique can also be applied to techniques relating to tunnel magnetoresistive (TMR) devices that can expand into magnetic memory devices.

BACKGROUND ART

Demands to increase storage capacity of storage devices know no bounds, since demands on storage, typically of image processing, have been increasingly made. Hard disc drives (HDDs) using magnetic recording have features of large capacity, non-volatility, and low cost and thereby hold a central position of storage devices. The market of such hard disc drives are now expanding, because they are more widely applied to fields of audiovisual apparatuses such as video recorders, and car navigation systems, in addition to personal computers. The market demands to minimize the size of memory. It is now predicted that memory capacity of 100 gigabits per square inches can be achieved with a magnetic material size of about 30 nm (300 angstroms) in 2004, and memory capacity of 1000 gigabits per square inches can be achieved with a magnetic material size of about 10 nm (100 angstroms) in 2010.

To allow magnetic materials for storage to have a finer size and a higher density (integration), the sensitivities of reproducing heads or magnetic sensors must be increased. The sensitivity is represented by magnetoresistive (MR) ratios. Downsizing of reproducing heads have been achieved by increasing MR ratio of sensing elements constituting the reproducing heads.

Regarding the MR ratio, giant magnetoresistive (GMR) devices with MR ratio of 4% have been developed and brought into practice since around 1994 (Patent Document 1). Those with MR ratio of about 10% are about to be released. At a storage density of 100 gigabits per square inches or more, however, the MR ratio of the GMR devices is still insufficient, and MR ratio of about ten percent to about several ten percent is required.

Tunnel magnetoresistive (TMR) devices having a MR ratio of 10% or more in development phase were achieved in 2000. The TMR devices could achieve a higher MR ratio that could not be achieved by conventional GMR devices (Non-patent Document 1).

Such TMR devices can be applied not only as magnetic sensors but also as magnetic memories. IBM announced a joint development project for launching 256 megabit-MRAM on the market in 2004. Accordingly, the importance of the TMR devices is increasing.

Patent Document 1: Japanese Unexamined Patent Application Publication No. 2000-11330
Non-patent Document 1: Ohashi et al., NEC "Low Resistance Tunnel Magnetoresistive Head", "IEEE Transaction on Magnetics, Vol. 36, No. 5, pp. 2549-2553, 2000
Non-patent Document 2: M. Bowen et al., App. Phys. 82 (2003) 233
Non-patent Document 3: M. Kawasaki, Y. Tokura et al., Jpn. J. Appl. Phys. Vol. 42 (2003) L369-L372

DISCLOSURE OF INVENTION

The TMR devices are devices using spin-polarized tunneling magnetoresistance in ferromagnetic (including ferrimagnetic) tunnel junctions. The ferromagnetic (including ferrimagnetic) tunnel junction has a sandwich structure including a sufficiently thin insulator layer typically of $Al_2O_3$ sandwiched between ferromagnetic (including ferrimagnetic) metal layers of a transition metal such as iron. Fundamental physical phenomena of TMR are caused by the fact that the probability of tunneling of conductive electrons through the barrier of the insulating layer varies depending on the spin directions of the upper and lower ferromagnetic (including ferrimagnetic) layers. Above-mentioned Non-patent Document 2 demonstrates that a higher MR ratio than those of regular transition metals can be obtained by using a perovskite oxide in ferromagnetic (including ferrimagnetic) metal layers constituting a TMR device. The MR ratio of the resulting TMR device is more than 1800% at 4 K. TMR devices of this type are called "colossal magnetoresistive (CMR) devices".

The CMR devices using a perovskite oxide in ferromagnetic (including ferrimagnetic) metal layers are expected to have properties much higher than those of conventional TMR devices. However, they are practically insufficient in control of spin retention.

Under these circumstances, an object of the present invention is to provide a device that can maintain its spin retention even at room temperature.

Figure 1:
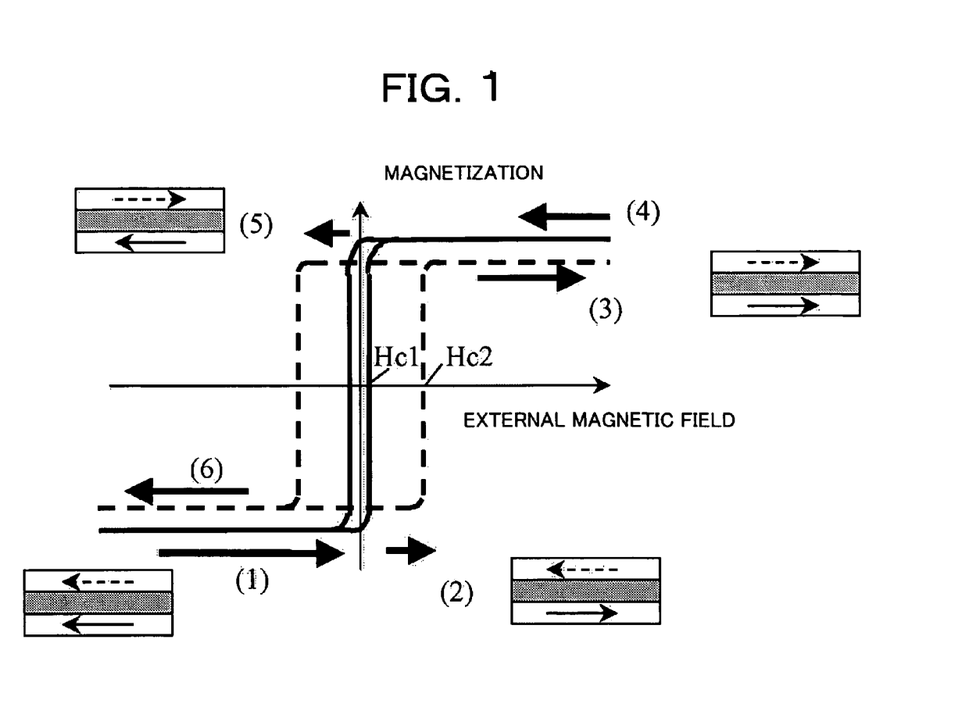
FIG. 1 is a diagram explaining the magnetization properties of a tunnel junction device and upper and lower ferromagnetic electrodes.

To practically use CMR devices, an upper ferromagnetic electrode and a lower ferromagnetic electrode must have different spin retentions. The reason of this will be explained with reference to FIGS. 1 and 2. The spin direction and magnetization hysteresis curve of the lower ferromagnetic electrode are indicated by solid lines, and the spin direction and hysteresis curve of the upper ferromagnetic electrode are indicated by broken lines.

Figure 2:
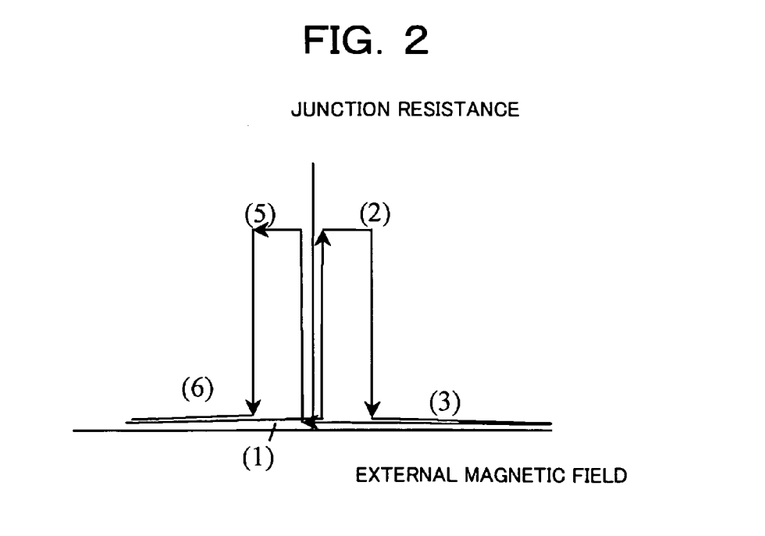
FIG. 2 is a diagram showing how the resistance of a tunnel junction device varies in response to an external magnetic field.

Initially, an external magnetic field facing leftward (magnetic field is in minus direction) is applied at a sufficient intensity to direct the spins of the upper and lower ferromagnetic electrodes leftward [the condition (1)]. Next, when the external magnetic field decreases to cross zero point and then faces rightward, the spins of the lower ferromagnetic electrode reverse rightward at a low intensity Hc1 of the external magnetic field. The intensity Hc1 of the external magnetic field is defined as the intensity of spin retention of the lower ferromagnetic electrode. When Hc1 is small, the spin direction can be reversed at a weak magnetic field. The spin retention of the upper ferromagnetic electrode is defined as Hc2. When the external magnetic field H is in the range where Hc2>H>Hc1 [the condition (2)], the spins of the lower ferromagnetic electrode face rightward, but those of the upper ferromagnetic electrode keep facing leftward. The resistance of the TMR device is greater in the spin condition (2) than in the spin condition (1). As the intensity of the rightward external magnetic field further increases and satisfies the condition: H>Hc2 [the condition (3)], the spins of the upper ferromagnetic electrode reverse so as to face rightward, the spins of the upper and lower ferromagnetic electrodes become in parallel, and the device thereby has a decreased resistance. The spins then undergo the conditions (4), (5), and (6), and return to the condition (1). The change in resistance herein is shown in FIG. 2. The TMR device has an increased resistance when the external magnetic field H satisfies the condition: Hc2>H>Hc1 [the condition (2)] or when the external magnetic field is negative [the condition (5)].

Figure 3:
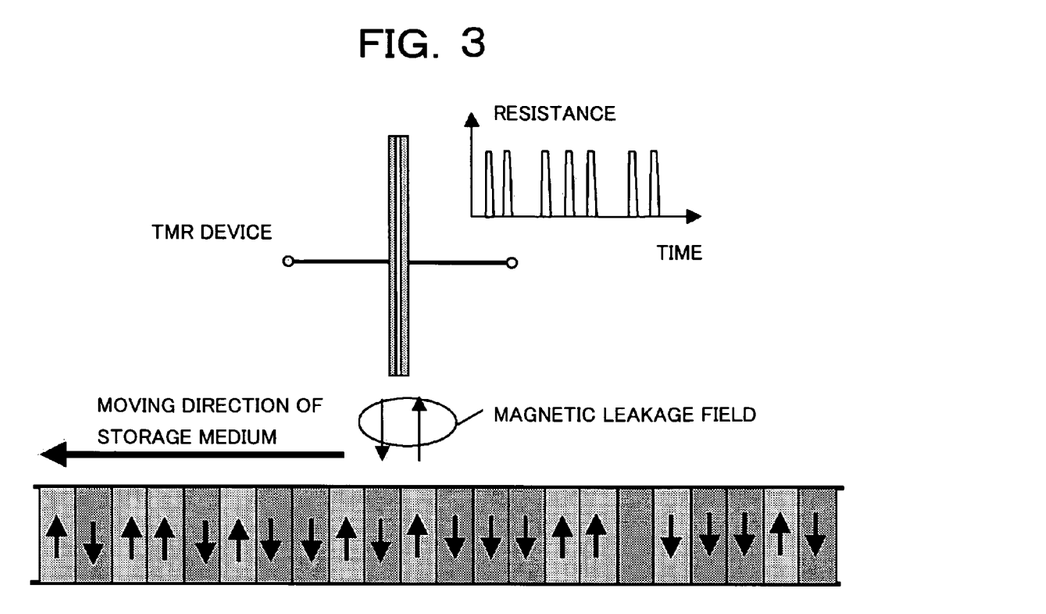
FIG. 3 is a diagram showing the relationship between a tunnel junction device and a storage medium.

FIG. 3 shows the relationship between a TMR device and a storage medium. The TMR device is arranged in the vicinity of the storage medium and reads out a magnetic leakage field generated from a spin domain embedded in the storage medium. The magnetic leakage field acts as an external magnetic field upon the TMR device, and the TMR device reads out a change of the external magnetic field as a change in resistance. Thus, zero-one (bit) information in the storage medium is read out as a change in resistance between the two electrodes of the TMR device. In the example illustrated in FIG. 3, the change of the external magnetic field corresponding to zero-one data is read out. In this case, if the difference between Hc2 and Hc1 is small, namely, if the difference in spin retention between the upper and lower ferromagnetic electrodes is small, the resistance significantly varies, and eventually the device becomes inoperable. If Hc2 is excessively strong, the sensitivity with respect to the external magnetic field decreases. The magnetic leakage field at the sensing position is determined depending on the intensity of magnetization of the storage medium material and the distance from the storage medium. Accordingly, suitable Hc2 must be selected and controlled under these conditions.

Figure 4:
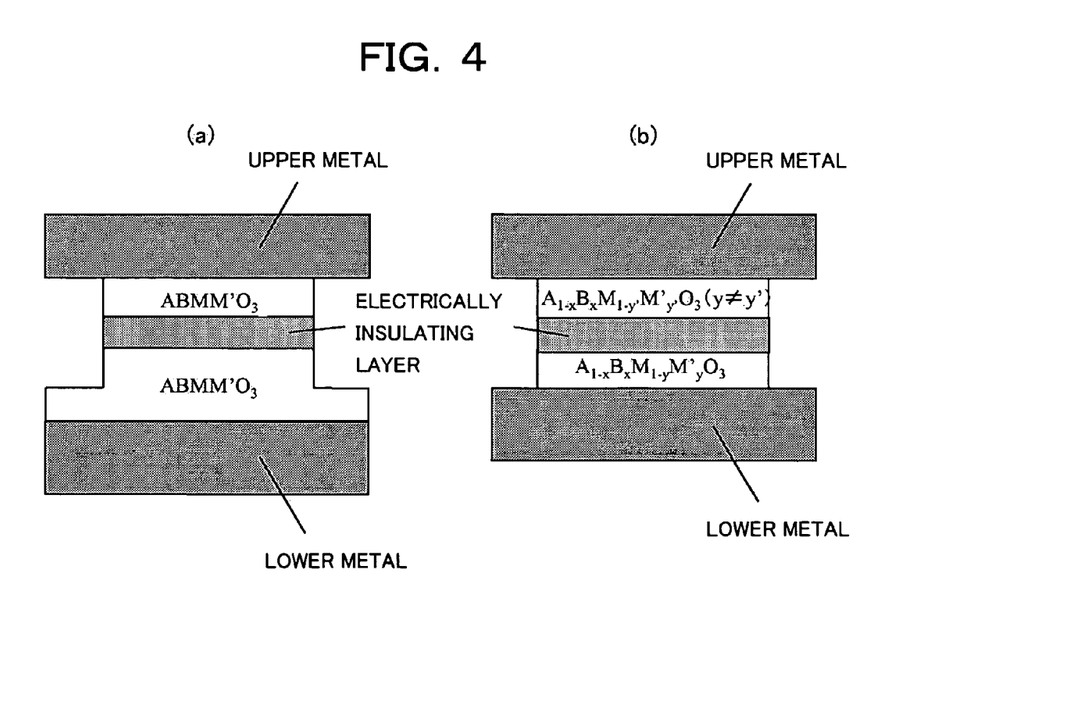
FIG. 4 shows schematic views of a tunnel junction device according to the present invention and a conventional tunnel junction device as a comparison.

The control of the spin retentions is a significant practical problem when perovskite ferromagnetic (including ferrimagnetic) electroconductive oxide materials are used as the upper and lower ferromagnetic electrodes. A possible solution to control the spin retentions is a process of controlling the shape of a ferromagnetic electrode so as to impart magnetic anisotropy to the electrode, as illustrated in FIG. 4(a). Specifically, the lower ferromagnetic electrode has a spin retention at an external magnetic field greater than that in the upper ferromagnetic electrode, by allowing the lower ferromagnetic electrode to have a convex shape (above-mentioned Nonpatent Document 3). However, the difference in spin retention between the upper and lower ferromagnetic electrodes must be properly controlled in practical use. Specifically, the control of spin retentions of the two electrodes is a practically significant problem, because the magnetization intensity of a spin domain bearing the information varies depending on the material thereof, and the intensity of magnetic leakage field from the domain which the sensor detects varies significantly depending on the arrangements of the spin domain and the sensor. Conventional control technique typically of stress using the shape effect as in the above-mentioned conventional technique fails to yield a sufficiently large difference in spin retention between the two electrodes. The resistance properties of the magnetic sensor become unstable greatly depending on the external environment such as production process and stress from a protecting film of the device. These are significant problems that must be solved.

The present inventors have found that the spin retentions of upper and lower ferromagnetic electrodes can be controlled by constituting the two electrodes from perovskite ferromagnetic (including ferrimagnetic) electroconductive oxides containing a plurality of different transition metal elements and having materials with different compositions (Claim 1). One of the two electrodes can comprise a perovskite ferromagnetic (including ferrimagnetic) electroconductive oxide containing Mn transition metal element, and the other can comprise a perovskite ferromagnetic (including ferrimagnetic) electroconductive oxide containing Mn and Ru transition metal elements (Claim 2). The device can be a device comprising two electrodes, and an electrically insulating layer arranged between these electrodes, in which one of the two electrodes is an electrode comprising a $La_{1-x}Sr_xMnO_{3-\delta}$ oxide as a ferromagnetic (including ferrimagnetic) electroconductive solid material, wherein x satisfies the condition: $0.2 \leq x \leq 0.5$; and $\delta$ represents an oxygen deficiency, and the other electrode is an electrode comprising a $La_{1-x}Sr_xMn_{1-y}Ru_yO_{3-\delta}$ oxide as a ferromagnetic (including ferrimagnetic) electroconductive solid material, wherein x and y satisfy the conditions: $0.2 \leq x \leq 0.5$, $0 < y \leq x$; and $\delta$ represents an oxygen deficiency (Claim 3). The device can also be a device comprising an electrode arranged on or above a substrate supporting the device, another electrode arranged above the former electrode with the interposition of an electrically insulating layer, wherein the former electrode comprises a $La_{1-x}Sr_xMnO_{3-\delta}$ oxide as a ferromagnetic (including ferrimagnetic) electroconductive solid material, wherein x satisfies the condition: $0.2 \leq x \leq 0.5$; and $\delta$ represents an oxygen deficiency, and wherein the latter electrode comprises a $La_{1-x'}Sr_{x'}Mn_{1-y}Ru_yO_{3-\delta}$ oxide as a ferromagnetic (including ferrimagnetic) electroconductive solid material, wherein x' and y satisfy the conditions: $0.2 \leq x' \leq 0.5$, $0y \leq x$; and $\delta$ represents an oxygen deficiency (Claim 4). In the device, the electrically insulating layer can comprise an $A_{1-x}B_xM_{1-y}M'_yO_{3-\delta}$ oxide, wherein x and y satisfy the conditions: $0 \leq x \leq 1$ and $0 \leq y \leq 1$; $\delta$ represents an oxygen deficiency; "A" represents an element selected from the group consisting of Ca, Sr, Ba, and other alkaline earth elements, La and other rare earth elements, elements including Y, Bi, and Pb; B represents another element which is different from "A", selected from the group consisting of Ca, Sr, Ba, and other alkaline earth elements, La and other rare earth elements, elements including Y, Bi, and Pb; M represents a transition metal element such as Mn, Fe, Co, Ni, or Cu; and M' represents another transition metal element such as Mn, Fe, Co, Ni, or Cu, M' being different from "M", (Claim 5). In the device, the electrically insulating layer can be $SrTiO_{3-\delta}$, wherein $\delta$ represents an oxygen deficiency (Claim 6). In the device, the electrically insulating layer can be $LaAlO_{3-\delta}$, wherein $\delta$ represents an oxygen deficiency (Claim 7). In any one of the devices as described above, at least one of the ferromagnetic (including ferrimagnetic) electroconductive solid materials constituting the electrodes, and a solid material constituting the electrically insulating layer arranged between these electrodes can be prepared by pulsed laser deposition (Claim 8). In the device prepared using pulse laser deposition, a $La_{1-x}Sr_xMn_{1-y}Ru_yO_{3-\delta}$ oxide solid material, wherein x and y satisfy the conditions: $0.2 \leq x \leq 0.5$, $0 < y \leq x$; and $\delta$ represents an oxygen deficiency, can be prepared as the ferromagnetic (including ferrimagnetic) electroconductive electrode by pulsed laser deposition using such a material that the resulting $La_{1-x}Sr_xMn_{1-y}Ru_yO_{3-\delta}$ oxide, wherein x and y satisfy the conditions: $0.2 \leq x \leq 0.5$, $0 < y \leq x$; and $\delta$ represents an oxygen deficiency, shows a lattice constant of 3.82 angstroms to 3.87 angstroms (Claim 9). In the device prepared using pulse laser deposition, a $La_{1-x}Sr_xMn_{1-y}Ru_yO_{3-\delta}$ oxide solid material, wherein x and y satisfy the conditions: $0.2 \leq x \leq 0.5$, $0 < y \leq x$; and $\delta$ represents an oxygen deficiency, can be prepared as the ferromagnetic (including ferrimagnetic) electroconductive electrode by pulsed laser deposition at a substrate temperature of 750° C. to 900° C. at an atmospheric oxygen pressure of 133 mPa (1 mTorr) to 13.3 Pa (100 mTorr) (Claim 10).

BEST MODE FOR CARRYING OUT THE INVENTION

A tunnel junction device structurally comprises an electrode, another electrode, and an electrically insulating layer arranged between these electrodes. The former electrode comprises an $A_{1-x}B_xM_{1-y}M'_yO_{3-\delta}$ oxide ferromagnetic (including ferrimagnetic) electroconductive solid material, wherein x and y satisfy the conditions: $0 \leq x \leq 1$ and $0 \leq y \leq 1$; δ represents an oxygen deficiency; "A" represents an element selected from the group consisting of Ca, Sr, Ba, and other alkaline earth elements, La and other rare earth elements, elements including Y, Bi, and Pb; B represents another element which is different from "A", selected from the group consisting of Ca, Sr, Ba, and other alkaline earth elements, La and other rare earth elements, elements including Y, Bi, and Pb; M represents a transition metal element such as Mn, Fe, Co, Ni, or Cu; and M' represents another transition metal element such as Mn, Fe, Co, Ni, or Cu, M' being different from "M", and the latter electrode comprises an $A_{1-x'}B_{x'}M_{1-y'}M'_{y'}O_{3-\delta}$ oxide ferromagnetic (including ferrimagnetic) electroconductive solid material having a component ratio y' being not equal to y, wherein x' and y' satisfy the conditions: $0 \leq x' \leq 1$, $0 < y' \leq 1$; and δ represents an oxygen deficiency.

Embodiments

Figure 5:
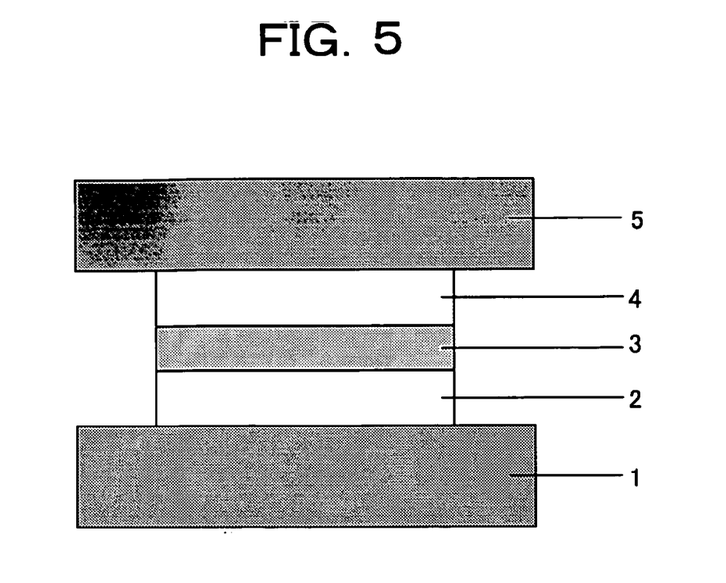
FIG. 5 is a schematic diagram of a tunnel junction device according to the present invention.

FIG. 5 is a schematic sectional view of a tunnel junction device according to the present invention. In FIG. 5, reference numeral 1 denotes a lower metal, reference numeral 2 denotes an $A_{1-x}B_xM_{1-y}M'_yO_{3-\delta}$ oxide ferromagnetic (including ferrimagnetic) electroconductive electrode, reference numeral 3 denotes an $A_{1-x}B_xM_{1-y}M'_yO_{3-\delta}$ oxide electrically insulating layer, reference numeral 4 denotes an $A_{1-x}B_xM_{1-y}M'_yO_{3-\delta}$ oxide ferromagnetic (including ferrimagnetic) electroconductive electrode, wherein y' being not equal to y, and reference numeral 5 denotes an upper metal.

Specifically, the device comprises an $A_{1-x}B_xM_{1-y}M'_yO_{3-\delta}$ oxide ferromagnetic (including ferrimagnetic) electroconductive electrode as one of two electrodes constituting the device, and an $A_{1-x}B_xM_{1-y}M'_yO_{3-\delta}$ oxide ferromagnetic (including ferrimagnetic) electroconductive electrode, wherein y' being not equal to y, as the other.

In the device, one of the two electrodes is an electrode comprising an $A_{1-x}B_xMnO_{3-\delta}$ oxide as a ferromagnetic (including ferrimagnetic) electroconductive solid material, wherein x satisfies the condition: $0 \leq x \leq 1$; δ represents an oxygen deficiency; "A" represents an element selected from the group consisting of Ca, Sr, Ba, and other alkaline earth elements, La and other rare earth elements, elements including Y, Bi, and Pb; and B represents another element which is different from "A", selected from the group consisting of Ca, Sr, Ba, and other alkaline earth elements, La and other rare earth elements, elements including Y, Bi, and Pb, and the other electrode is an electrode comprising another $A_{1-x'}B_{x'}Mn_{1-y}Ru_yO_{3-\delta}$ oxide as a ferromagnetic (including ferrimagnetic) electroconductive solid material, wherein x' and y' satisfy the conditions: $0 \leq x' \leq 1$, $0 < y' \leq 1$; and δ represents an oxygen deficiency.

In another embodiment of the device, one of the two electrodes is an electrode comprising a $La_{1-x}Sr_xMnO_{3-\delta}$ oxide as a ferromagnetic (including ferrimagnetic) electroconductive solid material, wherein x satisfies the condition: $0.2 \leq x \leq 0.5$; and δ represents an oxygen deficiency, and the other electrode is an electrode comprising a $La_{1-x}Sr_xMn_{1-y}Ru_yO_{3-\delta}$ oxide as a ferromagnetic (including ferrimagnetic) electroconductive solid material, wherein x' and y satisfy the conditions: $0.2 \leq x' \leq 0.5$, $0 < y \leq x$; and δ represents an oxygen deficiency.

The device, as an embodiment, can have a structure comprising an electrode arranged on or above a substrate supporting the device, another electrode arranged above the electrode with the interposition of an electrically insulating layer, in which the former electrode comprises a $La_{1-x}Sr_xMnO_{3-\delta}$ oxide as a ferromagnetic (including ferrimagnetic) electroconductive solid material, wherein x satisfies the condition: $0.2 \leq x \leq 0.5$; and δ represents an oxygen deficiency, and the latter electrode comprises a $La_{1-x}Sr_xMn_{1-y}Ru_yO_{3-\delta}$ oxide as a ferromagnetic (including ferrimagnetic) electroconductive solid material, wherein x' and y satisfy the conditions: $0.2 \leq x' \leq 0.5$, $0 < y \leq x$; and δ represents an oxygen deficiency.

In these devices, the electrically insulating layer can comprise an $A_{1-x}B_xM_{1-y}M'_yO_{3-\delta}$ oxide, wherein x and y satisfy the conditions: $0 \leq x \leq 1$ and $0 \leq y \leq 1$; δ represents an oxygen deficiency; "A" represents an element selected from the group consisting of Ca, Sr, Ba, and other alkaline earth elements, La and other rare earth elements, elements including Y, Bi, and Pb; B represents another element which is different from "A", selected from the group consisting of Ca, Sr, Ba, and other alkaline earth elements, La and other rare earth elements, elements including Y, Bi, and Pb; M represents a transition metal element such as Mn, Fe, Co, Ni, or Cu; and M' represents another transition metal element such as Mn, Fe, Co, Ni, or Cu, M' being different from "M".

The electrically insulating layer in the devices can comprise $SrTiO_{3-\delta}$ or $LaAlO_{3-\delta}$, wherein δ represents an oxygen deficiency.

In an embodiment of the devices, at least one of the ferromagnetic (including ferrimagnetic) electroconductive solid materials constituting the electrodes, and a solid material constituting the electrically insulating layer arranged between these electrodes is prepared by pulsed laser deposition.

In the devices, a $La_{1-x}Sr_xMn_{1-y}Ru_yO_{3-\delta}$ oxide solid material, wherein x and y satisfy the conditions: $0.2 \leq x \leq 0.5$, $0 < y \leq x$; and δ represents an oxygen deficiency, can be prepared as the ferromagnetic (including ferrimagnetic) electroconductive electrode by pulsed laser deposition using such a material that the resulting $La_{1-x}Sr_xMn_{1-y}Ru_yO_{3-\delta}$ oxide, wherein x and y satisfy the conditions: $0.2 \leq x \leq 0.5$, $0 < y \leq x$; and δ represents an oxygen deficiency, shows a lattice constant of 3.82 angstroms to 3.87 angstroms.

In another embodiment of the devices, a $La_{1-x}Sr_xMn_{1-y}Ru_yO_{3-\delta}$ oxide solid material, wherein x and y satisfy the conditions: $0.2 \leq x \leq 0.5$, $0 < y \leq x$; and $\delta$ represents an oxygen deficiency, can be prepared as the ferromagnetic (including ferrimagnetic) electroconductive electrode using pulsed laser deposition at a substrate temperature of 750° C. to 900° C. at an atmospheric oxygen pressure of 133 mPa (1 mTorr) to 13.3 Pa (100 mTorr).

Figure 6:
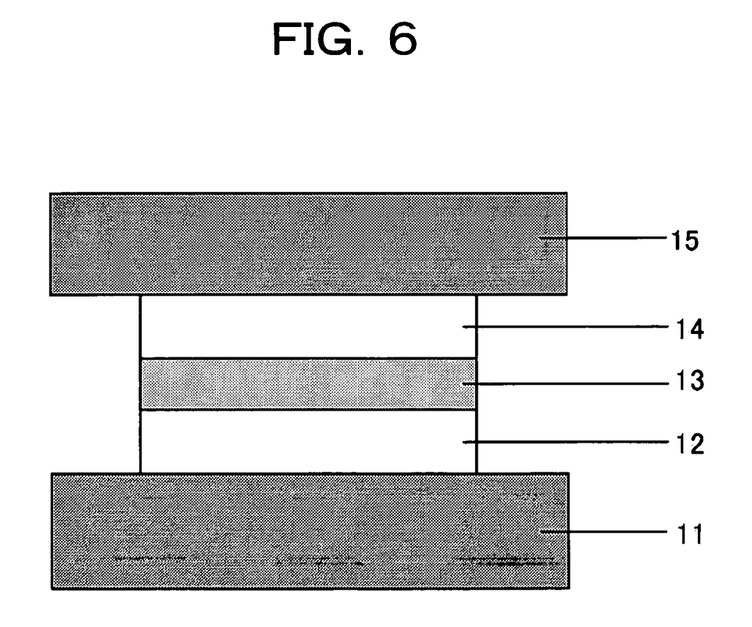
FIG. 6 is a schematic diagram of a tunnel junction device as an embodiment according to the present invention.

FIG. 6 is a sectional view of a tunnel junction device as an embodiment of the present invention.

In FIG. 6, reference numeral 11 denotes a lower metal, reference numeral 12 denotes a lower ferromagnetic (including ferrimagnetic) electroconductive electrode comprising a ferromagnetic metal material $La_{0.6}Sr_{0.4}MnO_{3-\delta}$, reference numeral 13 denotes an electrically insulating layer comprising $LaAlO_{3-\delta}$, reference numeral 14 denotes an upper ferromagnetic (including ferrimagnetic) electroconductive electrode comprising a ferromagnetic metal material $La_{0.6}Sr_{0.4}Mn_{1-y}Ru_yO_{3-\delta}$, and reference numeral 15 denotes an upper metal.

These ferromagnetic metal materials 12 and 14, and the electrically insulating layer 13 were deposited by pulsed laser deposition.

Figure 7:
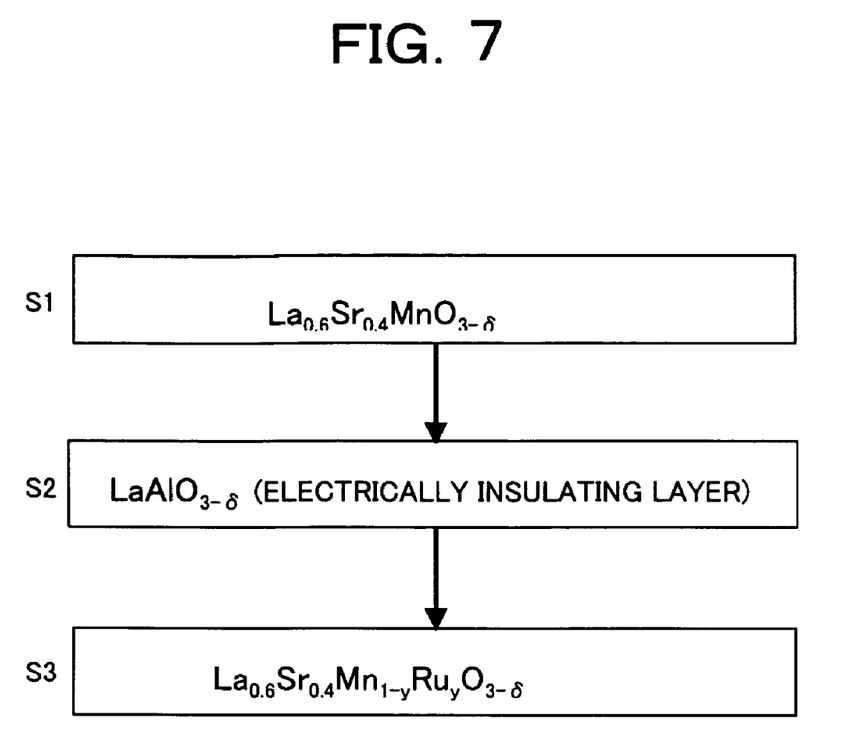
FIG. 7 is a diagram showing the production process of the tunnel junction device as the embodiment of the present invention.

FIG. 7 is a diagram showing the production process of the tunnel junction device shown in FIG. 6 by pulsed laser deposition.

With reference to FIG. 7, a ferromagnetic metal material $La_{0.6}Sr_{0.4}MnO_{3-\delta}$ (LSMO) for electroconductive electrode is initially deposited by pulsed laser deposition upon a lower electrode (Step S1). Next, $LaAlO_{3-\delta}$ as the electrically insulating layer is deposited thereon by pulsed laser deposition (Step S2). A ferromagnetic metal material $La_{0.6}Sr_{0.4}Mn_{1-y}Ru_yO_{3-\delta}$ (LSMRO) for another electroconductive electrode is then deposited thereon by pulsed laser deposition. Finally, an upper electrode is formed thereon (Step S3).

Figure 8:
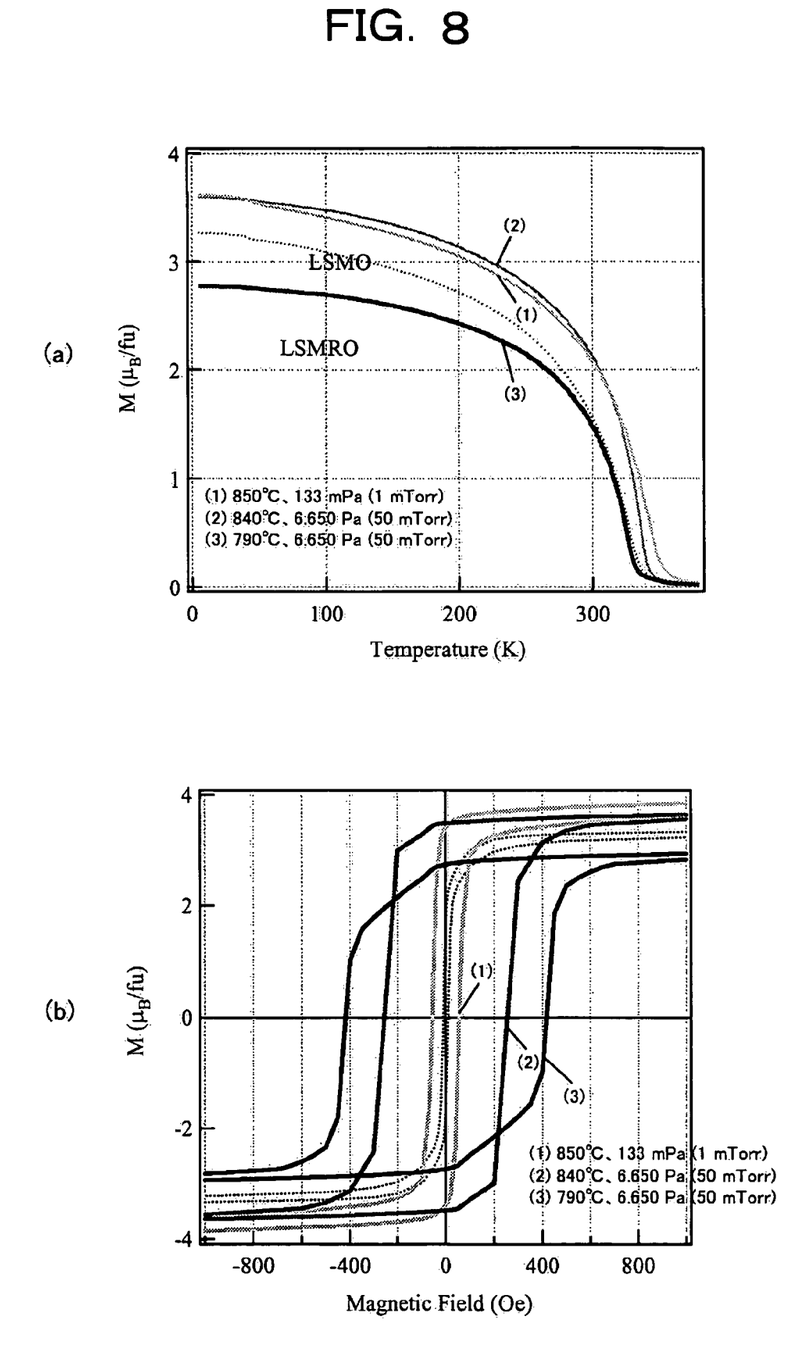
FIG. 8 includes graphs showing magnetization temperature characteristics and magnetization hysteric curves of ferromagnetic electrodes LSMRO and LSMO of the tunnel junction device according to the present invention.
Figure 9:
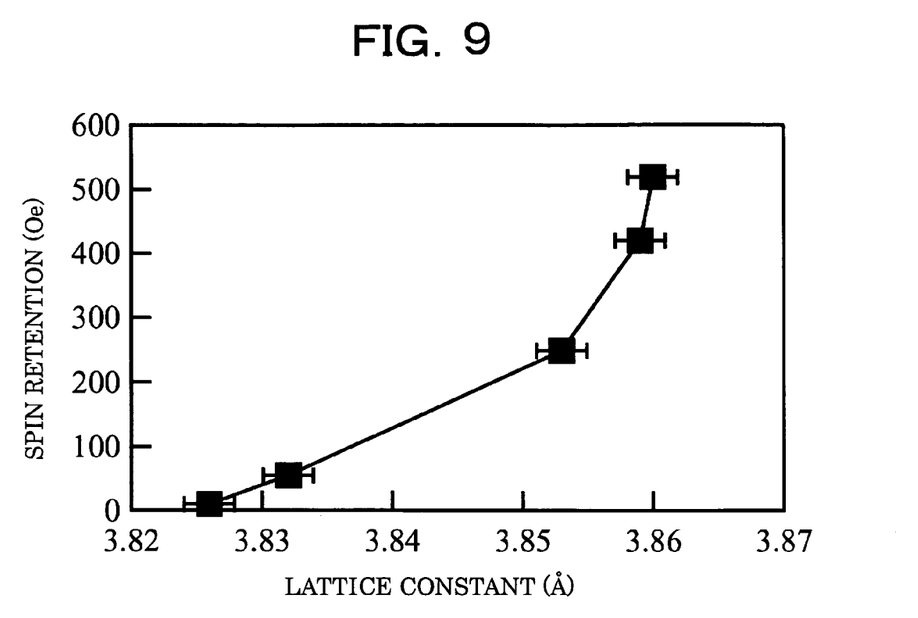
FIG. 9 is a graph showing control characteristics of the spin retention of the tunnel junction device according to the present invention by adjusting lattice constant.

FIG. 8 shows temperature dependency of the magnetizations of $La_{0.6}Sr_{0.4}MnO_{3-\delta}$ (LSMO). The spin retention (Hc1) of this layer is 10 oersteds or less as shown in FIG. 8(b). FIG. 8(a) shows temperature dependency and the magnetization hysteresis curves of the $La_{0.6}Sr_{0.4}Mn_{1-y}Ru_yO_{3-\delta}$ (LSMRO) when the production condition of pulsed laser, such as a substrate temperature and an oxygen partial pressure, varies. The production conditions of substrate temperatures and oxygen partial pressures herein are (1) 850° C. and 133 Pa (1 mTorr), (2) 840° C. and 6.650 Pa (50 mTorr), and (3) 790° C. and 6.650 Pa (50 mTorr). The results show that production conditions of $La_{0.6}Sr_{0.4}Mn_{1-y}Ru_yO_{3-\delta}$ (LSMRO) significantly affect the dependency on temperature and the spin retention of the resulting $La_{0.6}Sr_{0.4}Mn_{1-y}Ru_yO_{3-\delta}$ (LSMRO). In this procedure, a target sample to be irradiated with laser is a $La_{0.6}Sr_{0.4}Mn_{0.95}Ru_{0.05}O_{3-\delta}$ (LSMRO) having a Ru content y of 0.05. FIG. 8 demonstrates that the changes in spin retention can be described by the lattice constant of the $La_{0.6}Sr_{0.4}Mn_{1-y}Ru_yO_{3-\delta}$ (LSMRO) deposited in the device. Specifically, the spin retention of the $La_{0.6}Sr_{0.4}Mn_{1-y}Ru_yO_{3-\delta}$ (LSMRO) can be controlled by appropriately selecting the lattice constant thereof, as shown in FIG. 9. The lattice constant can be set by carrying out the production under suitably set conditions including the Ru content in the $La_{0.6}Sr_{0.4}Mn_{1-y}Ru_yO_{3-\delta}$ (LSMRO) as the target material for laser irradiation, the substrate temperature, and the oxygen partial pressure. In this case, the substrate temperature can be within the range of 750° C. to 900° C., and the oxygen partial pressure can be within the range of 133 mPa (1 mTorr) to 13.3 Pa (100 mTorr).

Figure 10:
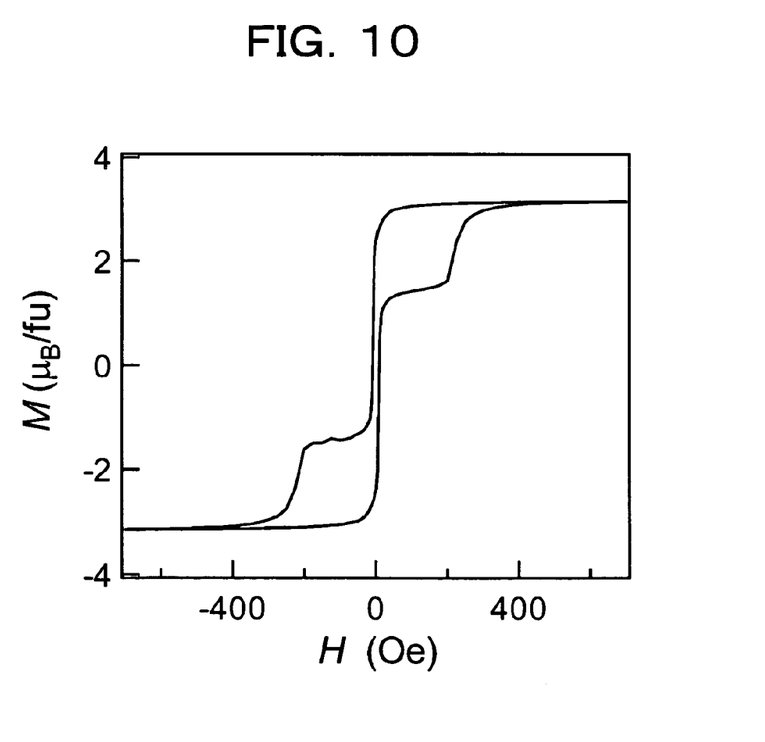
FIG. 10 shows the magnetization hysteresis curve of a LSMO/LAO/LSMRO multilayer film having the same film configuration as a tunnel junction device shown in the embodiment of the present invention.
Figure 11:
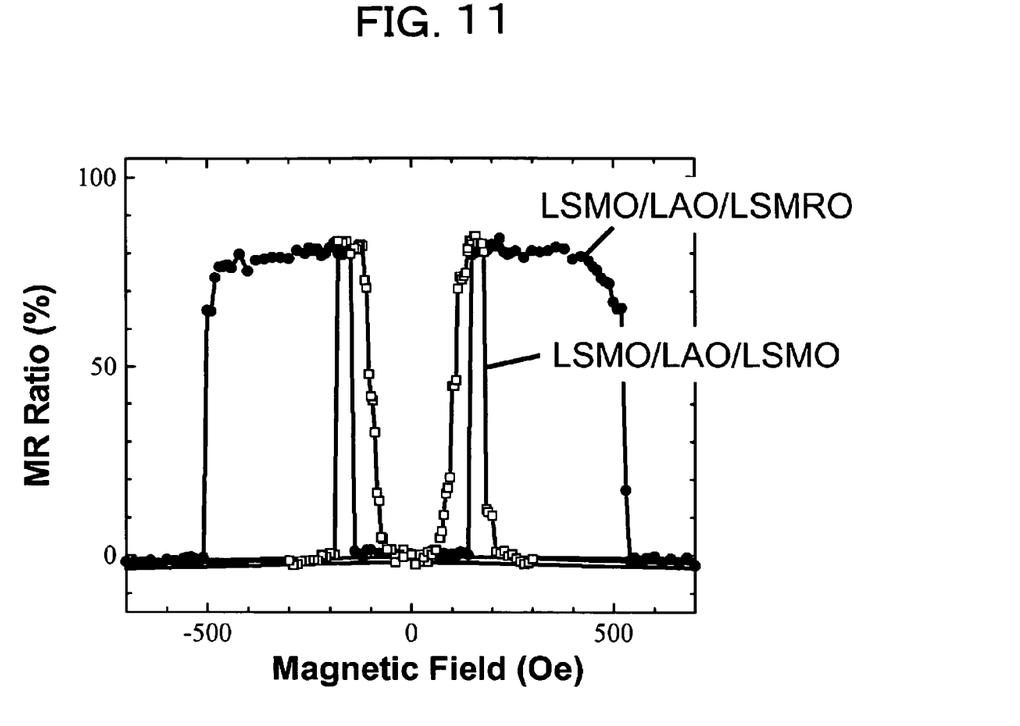
FIG. 11 shows the tunnel resistive ratio of the tunnel junction device according to the present invention.

FIG. 10 shows the magnetization hysteresis curve of the LSMO/LAO/LSMRO multilayer film constituting the tunnel junction device. FIG. 10 demonstrates that only the spins of the $La_{0.6}Sr_{0.4}MnO_{3-\delta}$ (LSMO) begin to align toward an external magnetic field at an external magnetic field intensity of several oersteds. The resistance in tunnel junction increases at this time. Next, the spins of the $La_{0.6}Sr_{0.4}Mn_{1-y}Ru_yO_{3-\delta}$ (LSMRO) begin to align and the tunnel junction resistance decreases at an external magnetic field intensity of about 300 oersteds. The saturation magnetization herein stands at a magnetization intensity of 3 μB. Next, the MR ratio of a tunnel junction device actually having lower and upper electrodes is shown in FIG. 11. The symbol "□" indicates the MR ratio data of a tunnel junction device having a LSMO/LAO/LSMO structure as a layer configuration in which Ru is not doped. The symbol "●" shows the MR ratio data of a tunnel junction device having a LSMO/LAO/LSMRO structure as a Ru-doped layer configuration according to the present invention. These results show that the latter shows a high resistance with respect to the external magnetization within a broader range and shows higher spin retention than the former.

This demonstrates that a tunnel junction device having an LSMO/LAO/LSMRO structure and ensuring its spin retention properly can be constituted by using a manganese (Mn) oxide material having an extraordinarily excellent spin polarization factor; and that the difference in spin retention between the upper and lower ferromagnetic electrodes can be controlled by suitably setting conditions in film deposition. Consequently, the spin retention can be suitably controlled according to the magnetization intensity of the storage medium material, the distance from the storage medium, and the magnetic leakage field at the sensing position.

The novel CMR devices according to the present invention have controlled spin retention and can serve as magnetic sensors capable of operating stably. This can provide immense magnetic memory devices of 100 gigabits up to the order of terabits and provide immense memories suitable for bearing information communications handling immense information in future. The novel CMR devices according to the present invention can be applied not only to magnetic sensors but also to magnetic memory devices which are now rapidly being developed. They can also be probably applied to oxide films for capacities of DRAM devices, since the tunneling current passing through such oxide film can be dramatically reduced by holding the directions of spins of materials for the ferromagnetic (including ferrimagnetic) electroconductive electrodes in antiparallel state. When micromagnets and the above-proposed magnetic sensor are arranged so as to face each other, the resulting article can be applied as switching sensors such as those for mobile phones, since the CMR devices can detect a magnetic field in a microdomain. Thus, the present invention can be possibly applied not only to magnetic memories but also to elementary elements in broad information networks.

It is to be understood that the present invention is not limited to the embodiments as mentioned above, and various modifications and variations can be made in accordance with the sprit of the invention and are included within the scope of the invention.

According to the present invention, the following advantages can be obtained.

Specifically, the present invention can provide magnetic sensors having controlled spin retention, which has not been achieved by conventional equivalents. The magnetic sensors can provide magnetic heads usable at a recording density of, for example, 100 gigabits per square inches to 1000 gigabits per square inches and provide CMR devices having properties as constitutional elements for magnetic, memories which are equivalent to DRAMs and FeRAMs.

INDUSTRIAL APPLICABILITY

The devices according to the present invention are suitable for high-performance magnetic sensors showing controlled spin retention.

The invention claimed is:

1. A tunnel junction device, comprising:
   a first electrode;
   a second electrode; and
   an electrically insulating layer arranged between the first electrode and the second electrode;
   wherein:
   the first electrode comprises an $A_{1-x}B_xM_{1-y}M'_yO_{3-\delta}$ oxide ferromagnetic (including ferrimagnetic) electroconductive solid material, wherein:
      x and y satisfy the conditions: $0 \leq x \leq 1$ and $0 \leq y \leq 1$;
      $\delta$ represents an oxygen deficiency;
      A represents an element selected from the group consisting of Ca, Sr, Ba, and other alkaline earth elements, La and other rare earth elements, and elements including Y, Bi, and Pb;
      B represents an element that is different from A, selected from the group consisting of Ca, Sr, Ba, and other alkaline earth elements, La and other rare earth elements, elements including Y, Bi, and Pb;
      M represents an element selected from the group consisting of Mn, Fe, Co, Ni, or Cu and other transition metal elements; and
      M' represents an element selected from the group consisting of Mn, Mn, Fe, Co, Ni, or Cu and other transition metal elements M' being different from "M"; and
   the second electrode comprises an $A_{1-x'}B_{x'}M_{1-y'}M'_{y'}O_{3-\delta}$ oxide ferromagnetic (including ferrimagnetic) electroconductive solid material having a component ratio y' that is not equal to y, wherein x' and y' satisfy the conditions: $0 \leq x' \leq 1$, $0 < y' \leq 1$.

2. The tunnel junction device according to claim 1, wherein:
   the first electrode is an electrode comprising an $A_{1-x}B_xMnO_{3-\delta}$ oxide as a ferromagnetic (including ferrimagnetic) electroconductive solid material; and
   the second electrode is an electrode comprising an $A_{1-x}B_xMn_{1-y}Ru_yO_{3-\delta}$ oxide as a ferromagnetic (including ferrimagnetic) electroconductive solid material.

3. The tunnel junction device according to claim 2, wherein:
   the first electrode is an electrode comprising a $La_{1-x}Sr_xMnO_{3-\delta}$ oxide as a ferromagnetic (including ferrimagnetic) electroconductive solid material, wherein x satisfies the condition: $0.2 \leq x \leq 0.5$; and
   the second electrode is an electrode comprising a $La_{1-x'}Sr_{x'}Mn_{1-y}Ru_yO_{3-\delta}$ oxide as a ferromagnetic (including ferrimagnetic) electroconductive solid material, wherein x' and y satisfy the conditions: $0.2 \leq x' \leq 0.5$, $0 < y \leq x$.

4. The tunnel junction device according to claim 3, wherein:
   the first electrode is arranged on or above a substrate supporting the device;
   the second electrode is arranged above the first electrode; and
   the electrically insulating layer, is interposed between the first electrode and the second electrode.

5. The tunnel junction device according to claim 1, wherein the electrically insulating layer is an electrically insulating layer comprising an $A_{1-x}B_xM_{1-y}M'_yO_{3-\delta}$ oxide, wherein:
   x and y satisfy the conditions: $0 \leq x \leq 1$ and $0 \leq y \leq 1$;
   $\delta$ represents an oxygen deficiency;
   A represents an element selected from the group consisting of Ca, Sr, Ba, and other alkaline earth elements, La and other rare earth elements, and elements including Y, Bi, and Pb;
   B represents an element which is different from A, selected from the group consisting of Ca, Sr, Ba, and other alkaline earth elements, La and other rare earth elements, and elements including Y, Bi, and Pb;
   M represents an element selected from the group consisting of Mn, Fe, Co, Ni, or Cu and other transition metal elements; and
   M' represents an element selected from the group consisting of Mn, Fe, Co, Ni, or Cu and other transition metal elements, M' being different from "M".

6. The tunnel junction device according to claim 1, wherein the electrically insulating layer comprises $SrTiO_{3-\delta}$, wherein $\delta$ represents an oxygen deficiency.

7. The tunnel junction device according to claim 1, wherein the electrically insulating layer comprises $LaAlO_{3-\delta}$, wherein $\delta$ represents an oxygen deficiency.

8. The tunnel junction device according to claim 1, wherein at least one of the ferromagnetic (including ferrimagnetic) electroconductive solid material constituting the first electrode, the ferromagnetic (including ferrimagnetic) electroconductive solid material constituting the second electrode, and a solid material constituting the electrically insulating layer is prepared by pulsed laser deposition.

9. The tunnel junction device according to claim 8, wherein:
   the solid material prepared by pulsed laser deposition is a $La_{1-x}Sr_xMn_{1-y}Ru_yO_{3-\delta}$ oxide solid material, wherein x and y satisfy the conditions: $0.2 \leq x \leq 0.5$, $0 < y \leq x$, and $\delta$ represents an oxygen deficiency;
   the solid material prepared by pulsed laser deposition is prepared using such a material that the resulting $La_{1-x}Sr_xMn_{1-y}Ru_yO_{3-\delta}$ oxide shows a lattice constant of 3.82 angstroms to 3.87 angstroms.

10. The tunnel junction device according to claim 8, wherein:
    the solid material prepared by pulsed laser deposition is a $La_{1-x}Sr_xMn_{1-y}Ru_yO_{3-\delta}$ oxide solid material, wherein x and y satisfy the conditions: $0.2 \leq x \leq 0.5$, $0 < y \leq x$, and $\delta$ represents an oxygen deficiency; and
    the solid material prepared by pulsed laser deposition is prepared at a substrate temperature of 750° C. to 900° C. at an atmospheric oxygen pressure of 133 mPa (1 mTorr) to 13.3 Pa (100 mTorr).

* * * * *